US012666589B2

(12) United States Patent
Wang

(10) Patent No.: US 12,666,589 B2
(45) Date of Patent: Jun. 23, 2026

(54) MEMORY CELL, MEMORY, AND METHOD OF MANUFACTURING THE SAME

(71) Applicant: SwaySure Technology Co., Ltd., Shenzhen (CN)

(72) Inventor: Jinghao Wang, Shenzhen (CN)

(73) Assignee: SWAYSURE TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 19/062,515

(22) Filed: Feb. 25, 2025

(65) Prior Publication Data

US 2025/0301623 A1      Sep. 25, 2025

(30) Foreign Application Priority Data

Mar. 21, 2024    (CN) .......................... 202410339162.1
Mar. 21, 2024    (CN) .......................... 202420562891.9

(51) Int. Cl.
H10B 12/00          (2023.01)
(52) U.S. Cl.
CPC .................................... H10B 12/00 (2023.02)
(58) Field of Classification Search
CPC . G11C 11/4096; G11C 11/4097; G11C 5/063; H10B 12/00; H10B 12/01; H10B 12/20; H10B 43/27; H10W 20/056; H10W 20/063; H10W 20/089; H10W 20/42; H10W 20/43; H10W 20/435; H10W 20/47
See application file for complete search history.

(56) References Cited

U.S. PATENT DOCUMENTS

2020/0091156 A1    3/2020  Sharma et al.
2022/0293180 A1*   9/2022  Lee .................... G11C 16/0483
2023/0165001 A1*   5/2023  Lee ........................ H10B 43/27
                                                            257/314

(Continued)

FOREIGN PATENT DOCUMENTS

CN        114792735        7/2022
CN        114864583        8/2022
CN        117425336        1/2024

(Continued)

OTHER PUBLICATIONS

KIPO, Office Action for KR Application No. 10-2025-0012311, Jul. 21, 2025.

(Continued)

*Primary Examiner* — Leonard Chang
*Assistant Examiner* — Nimarta Kaur Chowdhary
(74) *Attorney, Agent, or Firm* — Hodgson Russ LLP

(57)          ABSTRACT

A memory cell is provided in an isolation layer on a side of a substrate, the isolation layer includes an accommodation hole, the memory cell includes a channel layer, an insulating dielectric layer, a gate layer and a gate dielectric layer. The channel layer includes a first channel and a second channel spaced apart and stacked, the first channel is provided in the accommodation hole, the second channel is at least partially provided in the accommodation hole, the gate layer includes a first gate and a second gate, the first gate is formed within the first inner hole and directly or indirectly connected to the second channel, and the second gate is at least partially formed within the second inner hole; and a gate dielectric layer is formed between the gate layer and the channel layer.

19 Claims, 8 Drawing Sheets

(56) References Cited

U.S. PATENT DOCUMENTS

2023/0200052 A1    6/2023  Fulford et al.

FOREIGN PATENT DOCUMENTS

| | | | |
|---|---|---|---|
| CN | 117479527 | | 1/2024 |
| CN | 221930598 | | 10/2024 |
| CN | 120435007 A | * | 8/2025 |
| JP | 2013214729 | | 10/2013 |
| KR | 20230055290 | | 4/2023 |

OTHER PUBLICATIONS

CNIPA, Notification to Grant Patent Right for Invention for CN Application No. 202410339162.1, Aug. 29, 2025.
JPO, Office Action for JP Application No. 2025-014441, Nov. 11, 2025.

* cited by examiner

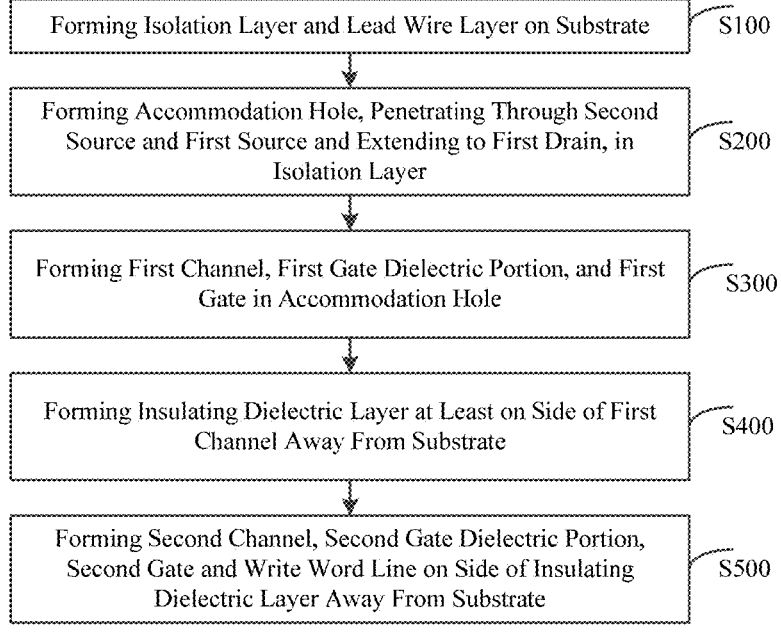

| | |
|---|---|
| Forming Isolation Layer and Lead Wire Layer on Substrate | S100 |
| Forming Accommodation Hole, Penetrating Through Second Source and First Source and Extending to First Drain, in Isolation Layer | S200 |
| Forming First Channel, First Gate Dielectric Portion, and First Gate in Accommodation Hole | S300 |
| Forming Insulating Dielectric Layer at Least on Side of First Channel Away From Substrate | S400 |
| Forming Second Channel, Second Gate Dielectric Portion, Second Gate and Write Word Line on Side of Insulating Dielectric Layer Away From Substrate | S500 |

FIG. 5

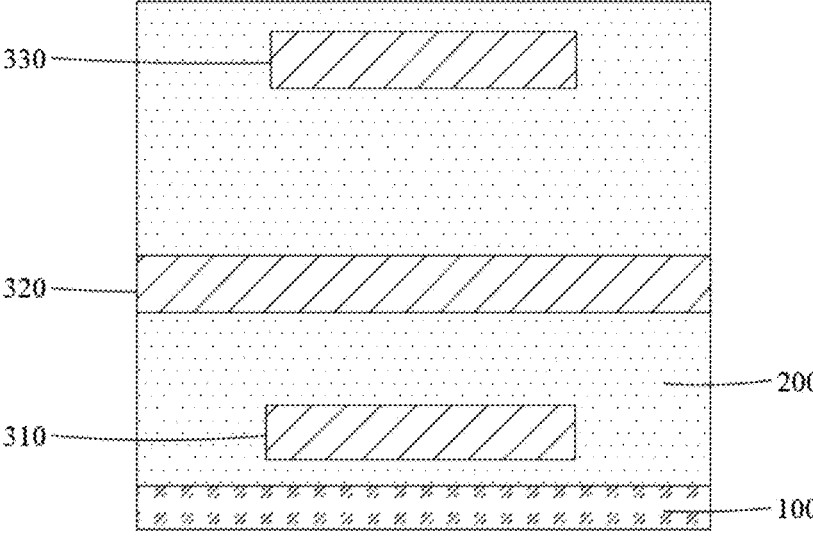

MEMORY CELL, MEMORY, AND METHOD OF MANUFACTURING THE SAME

CROSS-REFERENCE TO RELATED APPLICATIONS

This application claims priority to Chinese Patent Application No. 202410339162.1, filed on Mar. 21, 2024, and Chinese Patent Application No. 202420562891.9, filed on Mar. 21, 2024, the entire disclosures of which are hereby incorporated herein by reference.

TECHNICAL FIELD

The present application belongs to the field of semiconductor technology, and specifically relates to a memory cell, a memory, and a method of manufacturing the same.

BACKGROUND

A memory cell of a common dynamic random access memory (DRAM) is a drain of a Metal Oxide Semiconductor (MOS) transistor connected to a capacitor. The memory cell needs to constantly refresh the charge in the capacitor to ensure that the data is not lost, and needs to release the charge in the capacitor when reading, and then re-writes after the completion of reading, thus the power consumption is larger, and due to the large area occupied by the capacitor, the size minimization becomes a difficult problem.

Dual Transistor Zero Capacitor (2T0C) uses two MOS transistors as the memory cell, a drain of one transistor is connected to a gate of the other transistor, the gate capacitance is used to store the charge and change the transistor transconductance to store the information.

Existing dynamic random memories based on 2T0C memory cells generally use two thin film transistors (TFTs) of horizontal channel connected in the same plane, which occupies a larger area and has a lower integration density.

SUMMARY

There are provided a memory cell, a memory, and a method for manufacturing the same, according to embodiments of the present application. The technical solution is as below.

A first aspect of the present application provides a memory cell, provided in an isolation layer on a side of a substrate, the isolation layer including an accommodation hole, the memory cell including:

a channel layer, including a first channel and a second channel spaced apart and stacked, where the first channel is provided in the accommodation hole, the second channel is at least partially provided in the accommodation hole, a side of the first channel away from the substrate has a first inner hole, and a side of the second channel away from the substrate has a second inner hole;

an insulating dielectric layer, formed at least between the first channel and the second channel;

a gate layer, including a first gate and a second gate, wherein the first gate is formed within the first inner hole and directly or indirectly connected to the second channel, and the second gate is at least partially formed within the second inner hole; and a gate dielectric layer, formed between the gate layer and the channel layer.

A second aspect of the present application provides a memory, including:

a plurality of memory cells;

write word lines connecting second gates of the plurality of the memory cells;

write bit lines connecting second sources of the plurality of the memory cells;

readout word lines connecting first drains of the plurality of the memory cells; and readout bit lines connecting first sources of the plurality of the memory cells.

A third aspect of the present application provides a method of manufacturing a memory, including:

forming an isolation layer and a lead wire layer on a substrate, where the lead wire layer includes a first lead wire layer, a second lead wire layer, and a third lead wire layer formed sequentially and spaced apart, and the first lead wire layer, the second lead wire layer, and the third lead wire layer are provided in the isolation layer, where the first lead wire layer includes a first drain and a readout word line integrally connected, the second lead wire layer includes a first source and a readout bit line integrally connected, and the third lead wire layer includes a second source and a write bit line integrally connected;

forming an accommodation hole, penetrating through the second source and the first source and extending to the first drain, in the isolation layer;

forming a first channel, a first gate dielectric portion, and a first gate in the accommodation hole, where the first drain and the first source are connected to the first channel;

forming an insulating dielectric layer at least on a side of the first channel away from the substrate; and forming a second channel, a second gate dielectric portion, a second gate and a write word line on a side of the insulating dielectric layer away from the substrate, where the second channel, the second gate dielectric portion and the second gate are at least partially provided in the accommodation hole, the first gate is connected directly or indirectly to the second channel, the second source is connected to the second channel and the write word line is connected to the second gate.

Other features and advantages of the present application will become apparent through the following detailed description, or will be learned in part through the practice of the present application.

It should be understood that the above general description and the detailed description that follows are exemplary and explanatory only and do not limit the present disclosure.

BRIEF DESCRIPTION OF THE DRAWINGS

The accompanying drawings herein are incorporated into and form a part of the specification, illustrate embodiments in accordance with the present application, and are used in conjunction with the specification to explain the principles of the present application. Obviously, the accompanying drawings in the following description are only some of the embodiments of the present application, and other accompanying drawings may be obtained from these drawings without creative labor for those skilled in the art.

3

Figure 3:
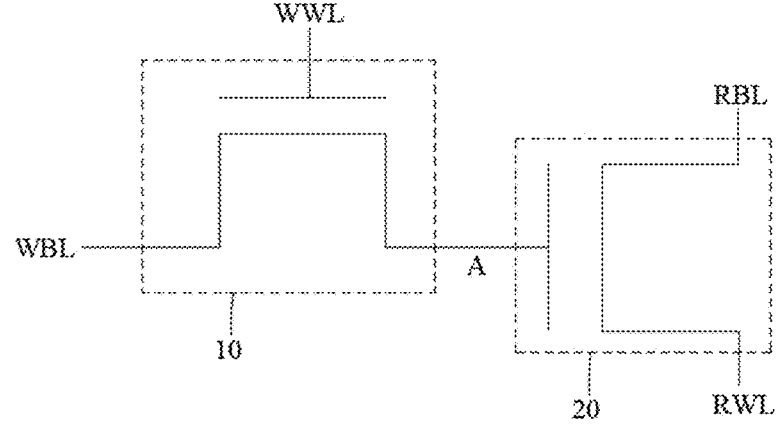

FIG. 3 is a schematic diagram of a circuit structure of the memory cell in embodiment one of the present application.

Figure 4:
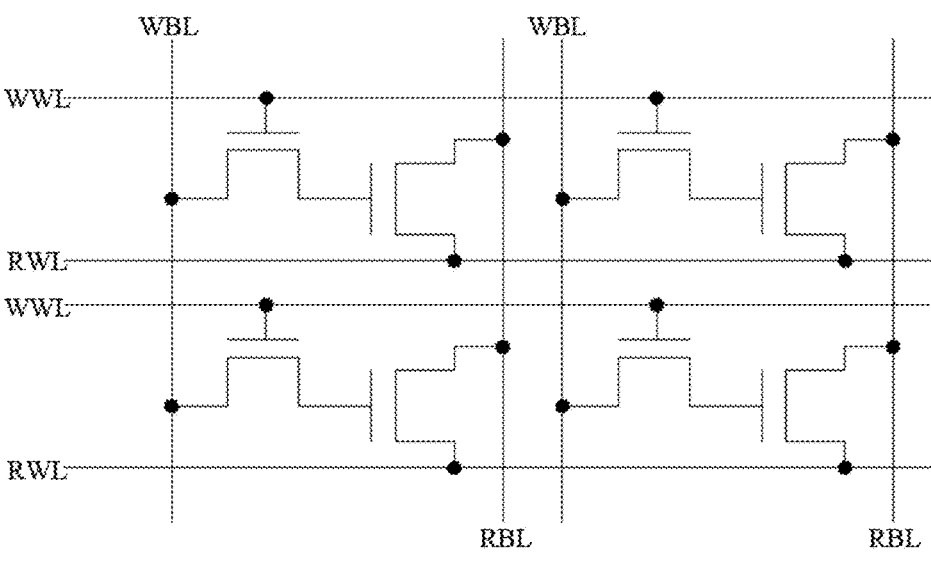

FIG. 4 is a schematic diagram of a circuit structure of the memory in embodiment one of the present application.

FIG. 5 is a flowchart of a method of manufacturing the memory in an embodiment of the present application.

FIG. 6 is a schematic diagram of forming an isolation layer and a lead wire layer in an embodiment of the present application.

Figure 7:
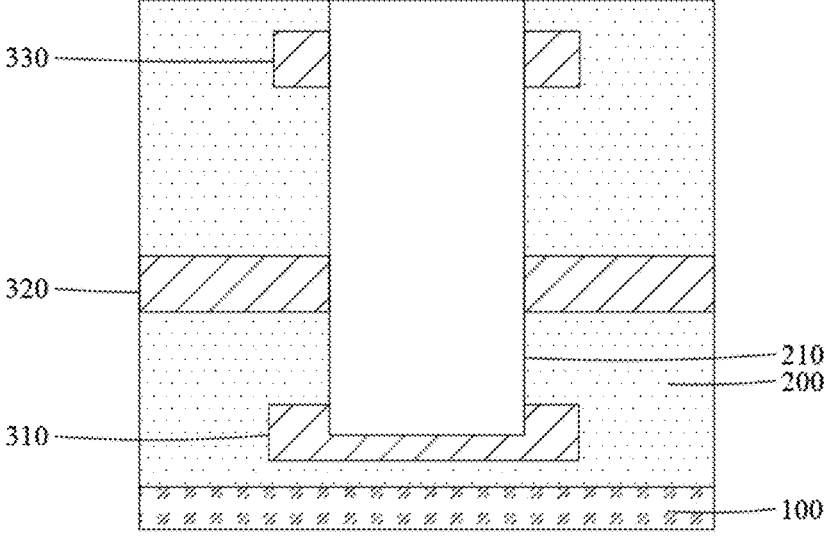

FIG. 7 is a schematic diagram of opening a hole in the isolation layer in an embodiment of the present application.

Figure 8:
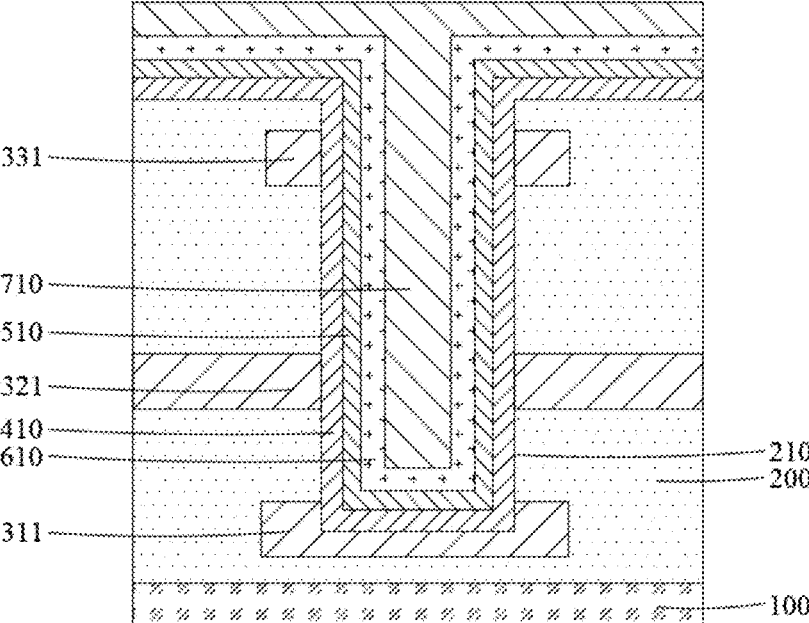

FIG. 8 is a schematic diagram of forming a first conductor layer in an embodiment of the present application.

Figure 9:
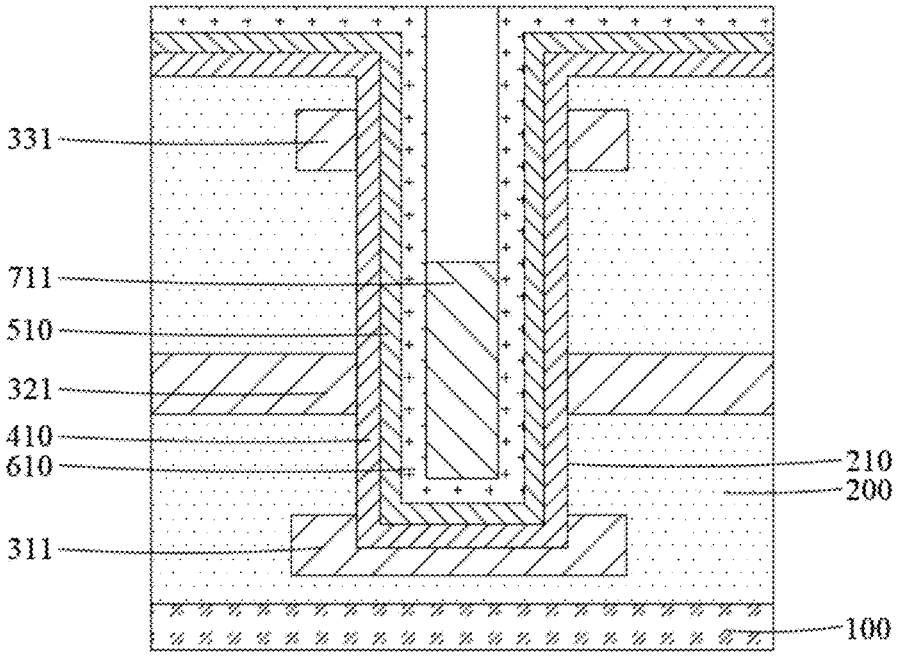

FIG. 9 is a schematic diagram of forming a first conductor portion in an embodiment of the present application.

Figure 10:
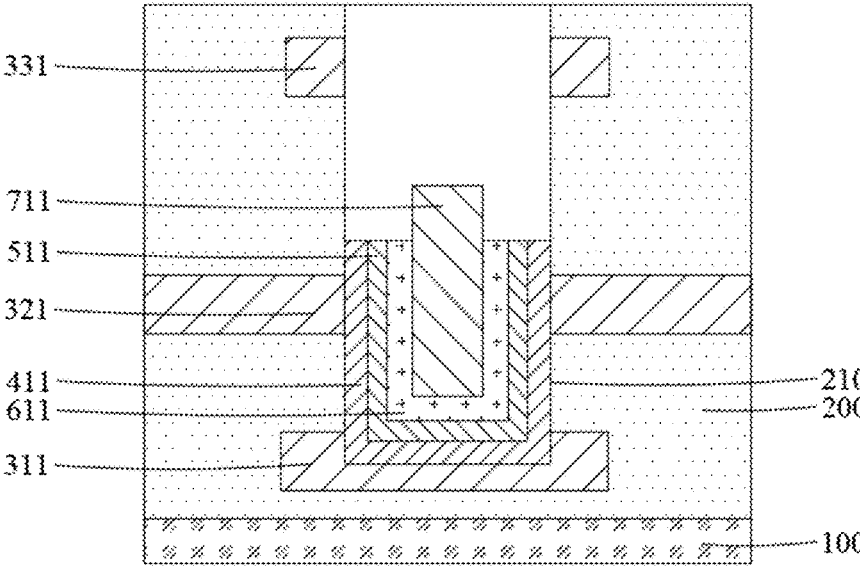

FIG. 10 is a schematic diagram of forming a read tube in an embodiment of the present application.

Figure 11:
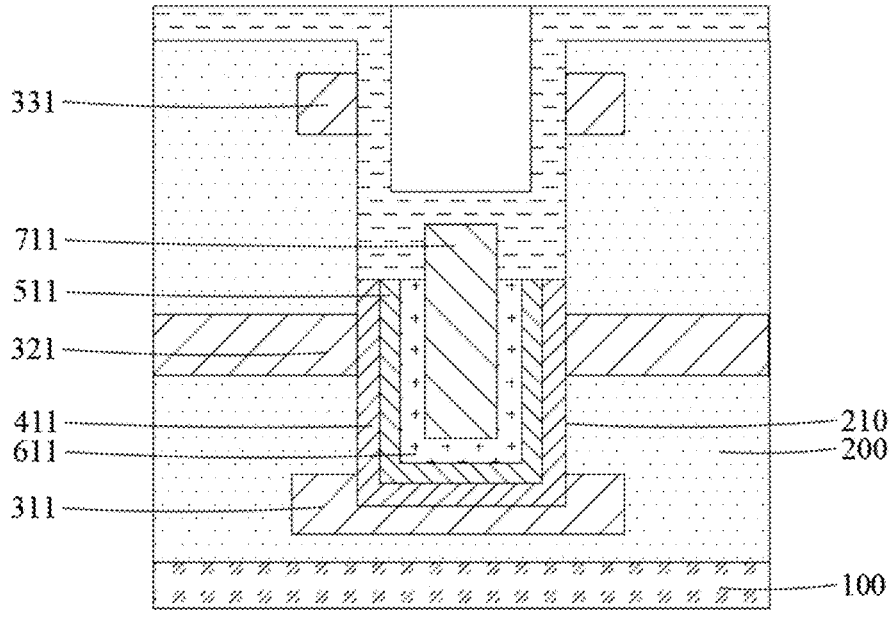

FIG. 11 is a schematic diagram of forming an insulating dielectric base layer in an embodiment of the present application.

Figure 12:
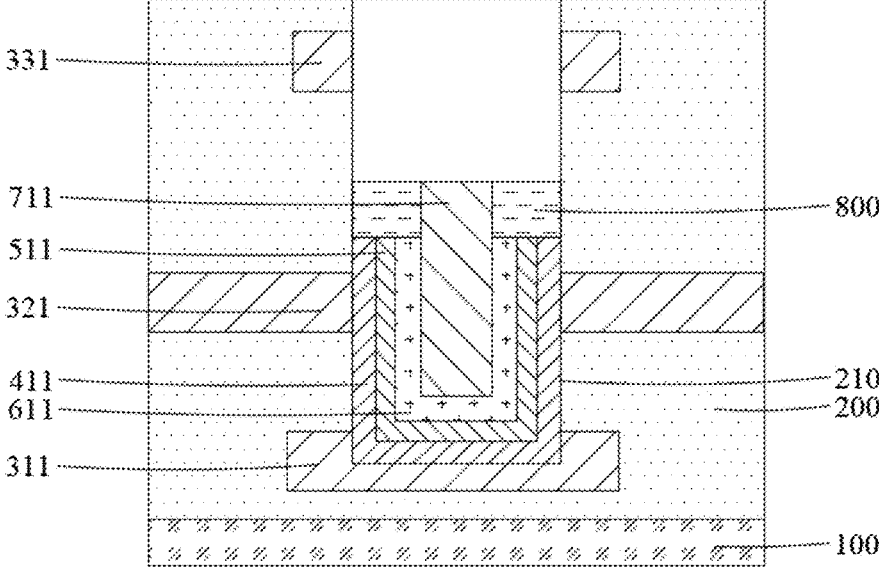

FIG. 12 is a schematic diagram of forming an insulating dielectric layer in an embodiment of the present application.

Figure 13:
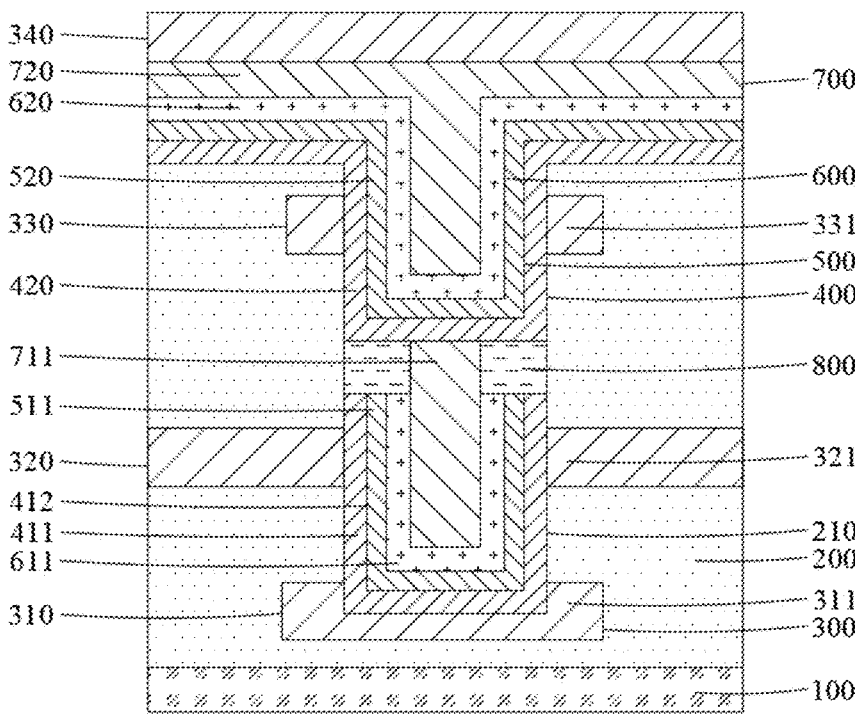

FIG. 13 is a schematic diagram of forming a fourth lead wire layer in an embodiment of the present application.

Figure 14:
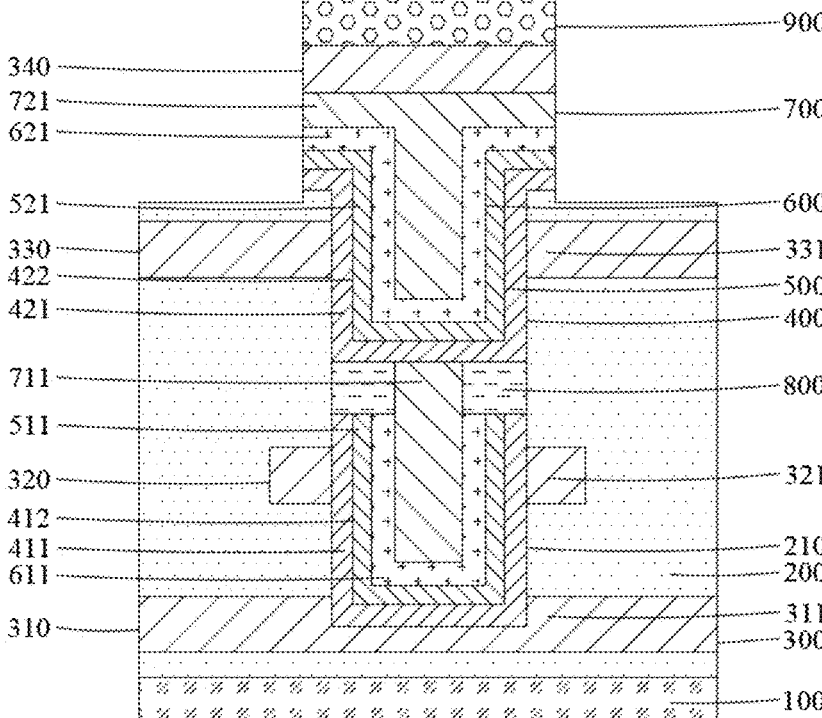

FIG. 14 is a cross-sectional view of forming a write-in tube in X-direction in an embodiment of the present application.

Figure 15:
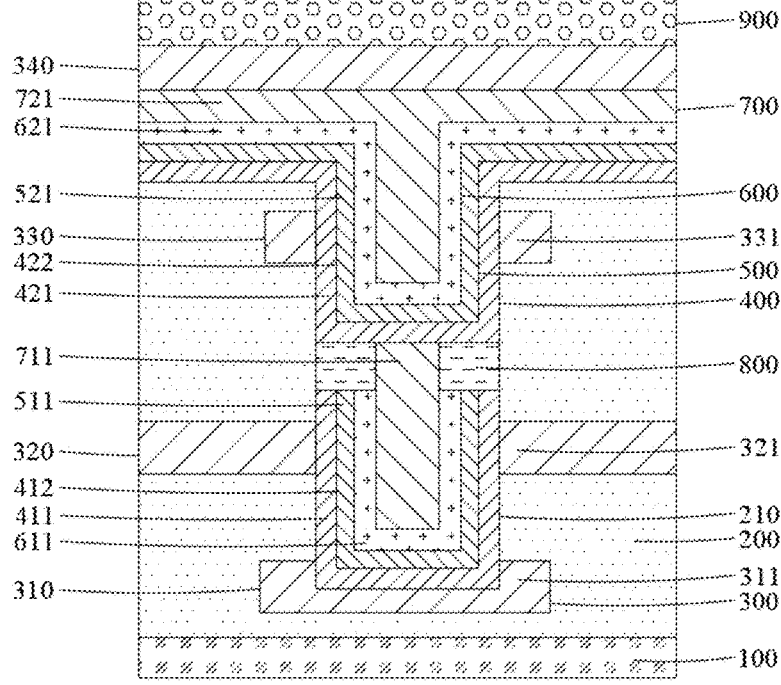

FIG. 15 is a cross-sectional view of forming a write-in tube in Y-direction in an embodiment of the present application.

DETAILED DESCRIPTION OF THE EMBODIMENTS

Example embodiments will now be described more fully with reference to the accompanying drawings. However, the example embodiments can be implemented in a variety of forms and should not be construed as being limited to the examples set forth herein; rather, the provision of these embodiments allows the present application to be more comprehensive and complete and conveys the idea of the example embodiments in a comprehensive manner to those skilled in the art.

In addition, the described features, structures, or characteristics may be combined in one or more embodiments in any suitable manner. In the following description, many specific details are provided thereby giving a full understanding of the embodiments of the present application. However, those skilled in the art will realize that it is possible to practice the technical embodiments of the present application without one or more of the specific details, or that other methods, components, devices, steps, etc. may be used. In other cases, well-known methods, devices, implementations, or operations are not shown or described in detail to avoid blurring aspects of the present application.

The present application is described in further detail below in connection with the accompanying drawings and specific embodiments. It should be noted herein that the technical features involved in the various embodiments of the present application described below may be combined with each other as long as they do not constitute a conflict with each other. The embodiments described below by reference to the accompanying drawings are exemplary and are intended to be used to explain the present application and are not to be construed as a limitation of the present application.

4

Figure 1:
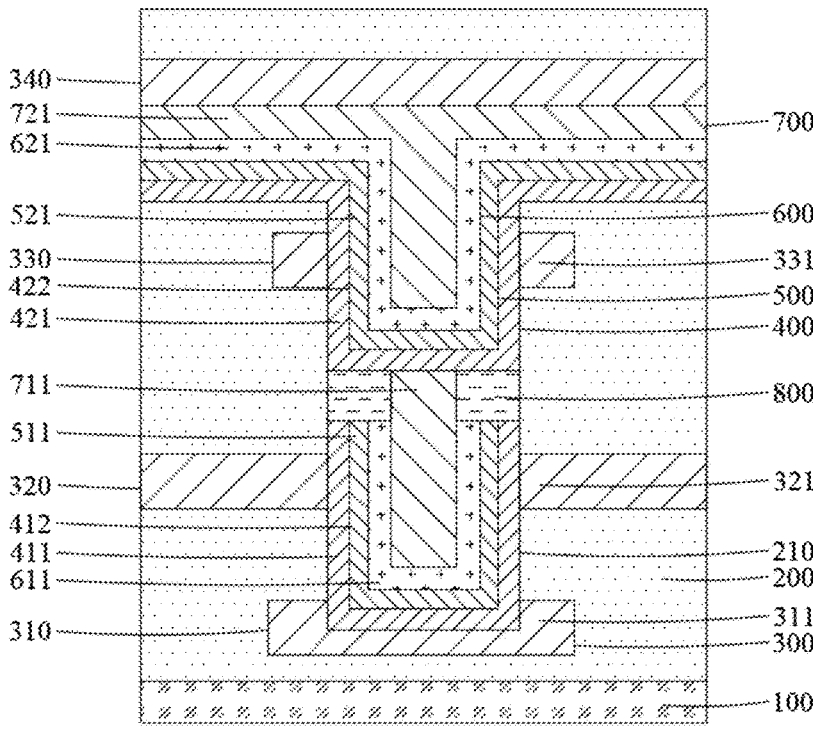
FIG. 1 is a cross-sectional view of a memory cell in X-direction in embodiment one of the present application.
Figure 2:
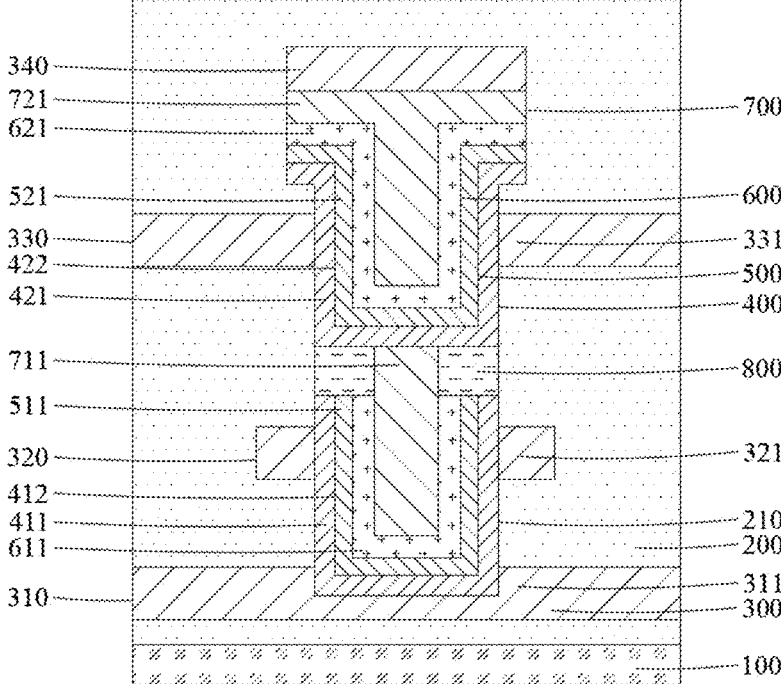
FIG. 2 is a cross-sectional view of the memory cell in Y-direction in embodiment one of the present application.

Referring to FIGS. 1 and 2, in the embodiment, a memory cell includes a source-drain, a channel layer 400, a gate dielectric layer 500, a gate layer 600, and an insulating dielectric layer 800. The memory cell is provided in an isolation layer 200 on the substrate 100 and connected to an extension of the lead wire layer 300.

The substrate 100 may be any substrate for carrying semiconductor integrated circuits known to those skilled in the art, and the substrate 100 is, for example, an insulating substrate, a semiconductor substrate, or a composite substrate, and is not limited herein. It will be appreciated that the substrate 100 may be removed after the fabrication of the memory cell is completed, and the memory cell is fabricated, and then is bonded with a top or bottom surface to other substrates after the substrate 100 is removed, and the other substrates are, for example, peripheral substrates including peripheral devices, or temporary support substrates, or substrates provided with other devices. The relationship between the substrate 100 and the memory cell is not specifically limited herein.

The channel layer 400 includes a first channel 411 and a second channel 421, the first channel 411 and the second channel 421 are spaced apart and stacked. The isolation layer 200 includes an accommodation hole 210. The first channel 411 is provided in the accommodation hole 210, and the second channel 421 is at least partially provided in the accommodation hole 210. A side of the first channel 411 away from the substrate 100 has a first inner hole 412, and a side of the second channel 421 away from the substrate 100 has a second inner hole 422.

The insulating dielectric layer 800 is formed at least between the first channel 411 and the second channel 421. The gate layer 600 includes a first gate 611 and a second gate 621, the first gate 611 is formed within the first inner hole 412 and directly or indirectly connected to the second channel 421. The second gate 621 is formed at least partially within the second inner hole 422. The first gate 611 and the second gate 621 are surrounded by the first channel 411 and the second channel 421, respectively, so that the transistor has a large channel width, increasing the read/write current of the transistor. The gate dielectric layer 500 is formed between the gate layer 600 and the channel layer 400 and plays a role of insulation between the gate and the channel. The gate dielectric layer 500 may include a first gate dielectric portion 511 and a second gate dielectric portion 521, the first gate dielectric portion 511 is provided between the first channel 411 and the first gate 611, and the second gate dielectric portion 521 is provided between the second channel 421 and the second gate 621.

As in the embodiment shown in FIG. 2, the lead wire layer 300 includes a first lead wire layer 310, a second lead wire layer 320, and a third lead wire layer 330 formed sequentially. The first lead wire layer 310, the second lead wire layer 320, and the third lead wire layer 330 are provided in the isolation layer 200. The source-drain includes a first drain 311, a first source 321, and a second source 331. Any one of the source-drains may be distinct from the lead wire layer, or may be a portion of the lead wire layer 300 that connects the channel layer 400, i.e., it is formed integrally with the lead wire layer 300, which is not specifically limited herein. In the embodiment, each of the source-drains is integral with the lead wire layer 300, i.e., the first lead wire layer 310 includes a first drain 311, the second lead wire layer 320 includes a first source 321, and the third lead wire layer 330 includes a second source 331. The first drain 311 and the first source 321 are both provided outside the accommodation hole 210 and are both connected to the first channel 411, and the second source 331 is provided outside the accommodation hole 210 and is connected to the second channel 421.

The memory cell includes two thin film transistors, the two thin film transistors are stacked on the substrate 100. The two thin film transistors are the read tube 20 and the write-in tube 10, the read tube 20 includes a first gate 611, a first channel 411, a first drain 311, and a first source 321, and the write-in tube 10 includes a second drain, a second source 331, a second channel 421, and a second gate 621.

Existing dynamic random memories based on 2T0C memory cells generally use two thin film transistors of horizontal channels connected in the same plane, which occupies a larger area and has a lower integration density.

In the embodiment, the memory cell includes a source-drain, a channel layer 400, a gate dielectric layer 500, and a gate layer 600, the channel layer 400 includes a first channel 411 and a second channel 421 spaced apart and stacked, the first channel 411 is provided in an accommodation hole 210, and the second channel 421 is at least partially provided in the accommodation hole 210, the gate layer 600 includes a first gate 611 and a second gate 621, the first gate 611 is formed in a first inner hole 412 of the first channel 411, the second gate 621 is at least partially formed in a second inner hole 422 of the second channel 421, a gate dielectric layer 500 is formed between the gate layer 600 and the channel layer 400, and the lead wire layer 300 includes a first drain 311, a first source 321, and a second source 331. The first drain 311 and the first source 321 are both connected to a periphery of the first channel 411, and the second source 331 is connected to a periphery of the second channel 421. The source-drain, the channel layer 400, the gate dielectric layer 500, and the gate layer 600 form a read tube 20 and a write-in tube 10 of vertical channels stacked, and the channels of the read tube 20 and the write-in tube 10 are located in the same accommodation hole 210, which reduces the area occupied by the memory cell and improves the integration density of the transistors, as compared with the memory cell using two thin film transistors of horizontal channels connected in the same plane.

In addition, the first channel 411 is wholly provided in the accommodation hole 210, the second channel 421 is at least partially provided in the accommodation hole 210, and the first channel 411 and the second channel 421 are stacked in the same accommodation hole 210, which can simplify the process of manufacturing the memory and reduce the cost of manufacturing the memory in the process of forming the write-in tube 10 and the read tube 20 vertically stacked.

Referring to FIGS. 1 and 2, the memory cell further includes a conductor layer 700, the conductor layer 700 includes a first conductor portion 711, the first conductor portion 711 is at least partially provided between the first gate 611 and the second channel 421, the first gate 611 and the second channel 421 are indirectly connected through the first conductor portion 711.

The first conductor portion 711 may store or drain charge when the write-in tube 10 is turned on, and the charge stored in the first conductor portion 711 affects the read current of the read tube 20. Therefore, the first conductor portion 711 may be made of a conductive material that has a high ability to maintain charge, such as doped polysilicon, but which is not limited herein, as long as the material of the conductor layer 700 is capable of charge storage.

Referring to FIGS. 1 and 2, the insulating dielectric layer 800 is provided around the first conductor portion 711. The positive projection of the first conductor portion 711 on the substrate 100 is provided within the positive projection of the first gate 611 on the substrate 100, and the first gate 611 is provided between the first conductor portion 711 and the first gate dielectric portion 511 of the gate dielectric layer 500. That is, the insulating dielectric layer 800 separates the first gate 611, the first gate dielectric portion 511, and the first channel 411 from the second gate 621, the second gate dielectric portion 521, and the second channel 421.

The insulating dielectric layer 800 is provided around the first conductor portion 711, separating the first conductor portion 711 from the first channel 411, thereby avoiding the first conductor portion 711 from short-circuiting with the first channel 411, i.e., avoiding short-circuiting of the gate of the read tube 20 with the channel, thereby affecting the function of the read tube 20. Referring to FIGS. 1 and 2, the first conductor portion 711 is extended at least partially into the first gate 611 within the first inner hole 412.

The first conductor portion 711 is provided in a recess formed on the surface of the side of the first gate 611 away from the first channel 411, and the first conductor portion 711 is connected to the second channel 421, such design can improve the electrical characteristics of the read tube 20 while improving the performance of the memory cell.

Referring to FIGS. 1 and 2, an upper surface of the first conductor portion 711 is higher than an upper surface of the first gate 611. The first gate 611 and the second channel 421 are spaced apart, the first conductor portion 711 is partially provided in and partially outside the first inner hole 412, and the first gate 611 and the second channel 421 are indirectly connected through the first conductor portion 711.

The first gate 611 and the second channel 421 are spaced apart, the first conductor portion 711 is connected to the second channel 421, and the first gate 611 is not connected to the second channel 421, which can make the first gate 611 of the read tube 20 and the first conductor portion 711 use different materials, thereby making the material selection of the first gate 611 of the read tube 20 conform to the demands of the electrical characteristics of the read tube 20, and since the first conductor portion 711 whose material has a stronger charge holding capacity is used, thus the storage performance of the memory cell is ensured.

Referring to FIGS. 1 and 2, the height of the upper surface of the first conductor portion 711 relative to the substrate 100 is greater than or equal to the height of the upper surface of the insulating dielectric layer 800 relative to the substrate 100.

The first conductor portion 711 is flush with or slightly higher than the insulating dielectric layer 800, which ensures that the first conductor portion 711 is reliably connected to the second channel 421, while the second channel 421 has a flatter preparation surface, thereby reducing leakage.

Referring to FIGS. 1 and 2, the conductor layer 700 further includes a second conductor portion 721, the second conductor portion 721 is at least partially provided in the second inner hole 422, and the second gate 621 is provided between the second conductor portion 721 and the second gate dielectric portion 521 of the gate dielectric layer 500.

The second conductor portion 721 is provided above the second gate 621, that is, in the recess formed on the upper surface of the second gate 621, and the second conductor portion 721 and the second gate 621 are stacked to be connected to the write word line WWL to improve the electrical connection between the second gate 621 and the write word line WWL. When the write word line WWL is prepared at the same time as the second conductor portion 721 and the second gate 621, a process cost can be reduced, the process difficulty is reduced, and the impedance of the write word line WWL is reduced, thereby reducing the signal delay.

Referring to FIGS. 1 and 3, the second gate 621 of the write-in tube 10 is connected to the write word line WWL, the second source 331 of the write-in tube 10 is connected to the write bit line WBL, and the second drain of the write-in tube 10 is connected to the storage node A. The first gate 611 of the read tube 20 is connected to the storage node A, the first source 321 of the read tube 20 is connected to the readout word line RWL, and the first drain 311 of the read tube 20 is connected to the readout bit line RBL.

It is to be understood that the connection relationships of the write word line WWL, the write bit line WBL and the write-in tube 10 are interchangeable, and the connection relationships of the readout word line RWL, the readout bit line RBL and the read tube 20 are interchangeable, and the operation methods of the write word line WWL, the write bit line WBL, the readout word line RWL, and the readout bit line RBL in the storage operation are correspondingly changed, which is not specifically limited herein.

The memory cell changes the charge in the gate capacitance of the read tube 20 by means of the write-in tube 10, which in turn affects the resistance state between the source of the read tube 20 and drain of the read tube 20, thereby realizing the distinction between "0" and "1". It is understood that, in this embodiment, the gate capacitance of the read tube 20 is the storage node A.

The specific storage principle of the memory cell is as follows:

During the process of writing "1", the write word line WWL adds a positive voltage (greater than the threshold voltage Vth) to the gate of the write-in tube 10, such that the write-in tube 10 is turned on, and the write bit line WBL adds a positive voltage to the source of the write-in tube 10 to inject a charge into the gate capacitance (i.e., the storage node A in FIG. 3) of the read tube 20. After the charge is injected, the gate and source voltages of the write-in tube 10 are withdrawn, and the "1" is preserved;

During the process of reading "1", the readout word line RWL adds a read voltage to the source of the read tube 20, since the gate capacitance preserves a certain amount of charge, the read tube 20 is in a lower resistance state, the readout bit line RBL obtains a larger current, after which can be amplified and identified by the peripheral circuit, the process of reading "1" is completed;

During the process of writing "0", the write word line WWL adds a positive voltage to the gate of the write-in tube 10 (greater than the threshold voltage Vth), such that the write-in tube 10 is turned on, the write bit line WBL adds the negative voltage to the source of the write-in tube 10 to the gate capacitance of the read tube 20 (i.e., storage node) to extract the charge. After the charge is extracted, the gate and source voltages of the write-in tube 10 are removed, and the "0" is preserved;

During the process of reading "0", the read word line RWL adds the read voltage to the source of the read tube 20, due to no charge in the gate capacitance, the read tube 20 is in a higher resistance state, the read bit line RBL obtains a smaller current, after which can be amplified and identified by the peripheral circuit, the process of reading "0" is completed.

Referring to FIGS. 1 and 2, it is shown that the first channel 411 is wholly provided within the accommodation hole 210 and the second channel 421 is at least partially provided within the accommodation hole 210. That is, the second channel 421 may be partially provided within the accommodation hole 210 and partially extended beyond a hole opening of the accommodation hole 210. A positive projection of the first channel 411 on the substrate 100 is located within a positive projection of the second channel 421 on the substrate 100. That is, the first channel 411 occupies an area less than or equal to the area occupied by the second channel 421. It is to be understood that the area occupied by the first channel 411 does not have a specific relationship with the area occupied by the second channel 421, which is not specifically limited herein.

The first channel 411 occupies an area less than or equal to the area occupied by the second channel 421, the read tube 20 and the write-in tube 10 can be completely overlapped together, which can reduce the occupancy area of the memory cell and improve the memory density. It is to be understood that as long as the positive projection of the first channel 411 on the substrate 100 and the positive projection of the second channel 421 on the substrate 100 have an overlap, the read tube 20 and the write-in tube 10 may be stacked on top of each other even though they do not completely overlap, which can reduce the occupancy area of the memory cell and improve the memory density.

Referring to FIGS. 1 and 2, in one embodiment, the first channel 411 and the second channel 421 are both cylindrical structures, and the first inner hole 412 and the second inner hole 422 are inner holes of the cylindrical structures. The cylindrical portion of the first channel 411 and the cylindrical portion of the second channel 421 are coaxially provided, and an outer diameter of the cylindrical portion of the first channel 411 and an outer diameter of the cylindrical portion of the second channel 421 are equal.

The cylindrical portion of the first channel 411 and the cylindrical portion of the second channel 421 are both provided in the accommodation hole 210 of the isolation layer 200, which can simplify the process of manufacturing the memory in the process of forming the write-in tubes 10 and the read tubes 20 vertically stacked, thereby reducing the cost of manufacturing the memory. Meanwhile, the cylindrical portion of the first channel 411 and the cylindrical portion of the second channel 421 are both provided in the accommodation hole 210 of the isolation layer 200, i.e., the main structures of the write-in tubes 10 and the read tubes 20 are both provided in the accommodation hole 210 of the isolation layer 200, which further reduces the occupancy area of the memory cell and improves the integration density of the transistors.

It is to be noted that the second channel 421, the second gate dielectric portion 521, and the second gate 621 may all be provided in the accommodation hole 210 of the isolation layer 200, but are not limited thereto, and the second channel 421, the second gate dielectric portion 521, and the second gate 621 may also include portions outside the accommodation hole 210, as the case may be.

Referring to FIGS. 1 and 2, the lead wire layer 300 includes a first lead wire layer 310, a second lead wire layer 320, and a third lead wire layer 330 spaced apart. The first lead wire layer 310 includes a first drain 311, the second lead wire layer 320 includes a first source 321, and the third lead wire layer 330 includes a second source 331. The first drain 311 and the first source 321 are located outside the accommodation hole 210 and are connected to the first channel 411, and the second source 331 is provided outside the accommodation hole 210 and connected to the second channel 421. The accommodation hole 210 penetrates through the second source 331 and the first source 321 to connect to the first drain 311.

That is, a positive projection of the first channel 411 on the substrate 100 is located within positive projections of the first drain 311 and the first source 321 on the substrate 100, and a positive projection of the second channel 421 on the substrate 100 is located within a positive projection of the second source 331 on the substrate 100. Specifically, the first channel 411 may be centered relative to the first drain 311 and the first source 321, and the second channel 421 may be centered relative to the second source 331.

The first channel 411 may be centered relative to the first drain 311 and the first source 321, and the second channel 421 may be centered relative to the second source 331, which may improve the contact area of the channels of the write-in tube 10 and the read tube 20 with the corresponding source-drains, thereby reducing the contact resistance of the source-drains, and the performance of the write-in tube 10 and the read tube 20 is improved, thereby improving the performance of the memory cell.

Referring to FIGS. 1 and 2, the first lead wire layer 310 crosses the second lead wire layer 320, the third lead wire layer 330 extends in the same direction as the first lead wire layer 310, and the first channel 411 is formed at the cross position of the first lead wire layer 310 and the second lead wire layer 320. Preferably, a positive projection of the first channel 411 on the substrate 100 is located within the positive projection of the cross position of the first lead wire layer 310 and the second lead wire layer 320 on the substrate 100.

Referring to FIGS. 1 and 2, a portion of the first channel 411 near one end of the substrate 100 is buried in the first drain 311. That is, the accommodation hole 210 of the isolation layer 200 partially enters into the first drain 311. The portion of the first channel 411 near one end of the substrate 100 enters into the first drain 311, which may improve the contact area of the first drain 311 and the first channel 411, and reduce the contact resistance, thereby improving the performance of the read tube 20. In other embodiments, the surface where the portion of the first channel 411 near the substrate 100 is connected to the first drain 311 is planar, or the portion of the first channel 411 near the substrate 100 is indirectly connected to the first drain 311 by other components.

Exemplarily, the substrate 100 may be any substrate for carrying semiconductor integrated circuits known to those skilled in the art, and the substrate 100 includes an insulating substrate, a semiconductor substrate, or a composite substrate, and is not limited by this application. Exemplarily, the substrate 100 may be body silicon (bulk silicon), silicon carbide, germanium, germanium-silicon, gallium arsenide, or insulator-on-semiconductor, etc.; in the insulator-on-semiconductor, the corresponding top layer semiconductor material is silicon, germanium, germanium-silicon, or gallium arsenide, etc.

The isolation layer 200 is used as an interlayer isolation layer and may be a silicon oxide or low k (dielectric constant) material layer to reduce crosstalk. The isolation layer 200 may include an air gap. It should be understood that the isolation layer 200 may be an insulating dielectric material common in the art and is not limited by this application.

The insulating dielectric layer 800 may be made of an insulating material such as nitride, nitrogen oxide, etc., and is not specifically limited by the present application.

In some embodiments, the material for manufacturing the isolation layer 200 is different from the material for manufacturing the insulating dielectric layer 800. The material of the insulating dielectric layer 800 is different from the material of the isolation layer 200 to enable etching selectivity between the insulating dielectric layer 800 and the isolation layer 200 to facilitate the fabrication of the memory cell. The lead wire layer 300 and the gate layer 600 may be made of a metal material with good electrical conductivity or a doped semiconductor material, and the metal material includes at least one of aluminum (Al), molybdenum (Mo), titanium (Ti), tungsten (W), and alloys thereof. The doped semiconductor material includes doped polysilicon. The gate layer 600 may be of a specific material selected according to the electrical characteristic needs of the write-in tube 10 and the read tube 20. The lead wire layer 300 and the gate layer 600 may be made of the same or different metal materials or doped semiconductor materials.

The first conductor portion 711 may be made of a conductive material capable of storing charge, such as doped polycrystalline silicon, but the present application is not limited thereto, as long as the material of the conductor layer 700 is capable of charge storage.

In some embodiments, the fabrication material of the conductor layer 700 is different from the fabrication material of the gate layer 600. The fabrication material of the conductor layer 700 and the fabrication material of the gate layer 600 are different, such that there are etching selectivity between the conductor layer 700 and the gate layer 600, and it is convenient for the fabrication of the memory cell.

The channel layer 400 may be made of Indium Gallium Zinc Oxide (IGZO), and the thin film transistor made of IGZO has an extremely small off-state current, which can be used for the dynamic random access memory of 2T0C to significantly reduce the leakage rate of the current. It should be understood that the channel layer 400 may be made of an indium gallium zinc oxide material, but is not limited thereto, and the channel layer 400 may also be other metal oxide or semiconductor materials, as the case may be.

The gate dielectric layer 500 may be selected from a material with a high dielectric constant or other materials commonly used in the field for gate dielectric layers, such as hafnium dioxide ($HfO_2$), silicon dioxide ($SiO_2$), and aluminum oxide ($Al_2O_3$).

The present application also provides a memory, the memory includes a plurality of connected memory cells.

Referring to FIGS. 1 to 4, the first lead wire layer 310 includes a first drain 311 and a readout word line RWL integrally connected, and the first drains 311 of the plurality of memory cells are led out through the connection with the readout word line RWL. The second lead wire layer 320 includes a first source 321 and a readout bit line RBL integrally connected, the first sources 321 of the plurality of memory cells are led out through the connection with the readout bit line RBL. A third lead wire layer 330 includes a second source 331 and a write bit line WBL integrally connected, the second sources 331 of the plurality of memory cells are led out through the connection with the write bit line WBL. The memory also includes a fourth lead wire layer 340, the fourth lead wire layer 340 is formed on the side of the second conductor portion 721 away from the substrate 100. The write word line WWL includes a portion of the fourth lead wire layer 340, and the second gates 621 of the plurality of memory cells are led out through the connection with the write word line WWL. The memory may also include an isolation material layer on the fourth lead wire layer 340, and the isolation layer 200 may be formed by stacking the plurality of isolation material layers.

In this embodiment, the memory includes a plurality of connected memory cells, the memory cells include a source-drain, a channel layer 400, a gate dielectric layer 500, and a gate layer 600. The channel layer 400 is formed on a side of the substrate 100, the channel layer 400 includes a first channel 411 and a second channel 421 stacked, the gate layer 600 includes a first gate 611 and a second gate 621, the first gate 611 is formed within a first inner hole 412 of the first channel 411 and connected to the second channel 421 directly or indirectly via a first conductor portion 711. The second gate 621 is at least partially formed within a second inner hole 422 of the second channel 421, a gate dielectric layer 500 is formed between the gate layer 600 and the channel layer 400, and the source-drains include a first drain 311, a first source 321 and a second source 331, the first drain 311 and the first source 321 are both connected to the first channel 411, and the second source 331 is connected to the second channel 421. The source-drain, the channel layer 400, the gate dielectric layer 500, and the gate layer 600 form the read tube 20 and the write-in tube 10 of the vertical channel stacked, which reduces the area occupied by the memory cell and improves the memory density per unit area, as compared to the memory cell formed by using two thin film transistors of horizontal channels connected in the same plane.

The present application also provides a method for manufacturing the memory, which is used for manufacturing the memory disclosed hereinbefore. Referring to FIGS. 5 to 15, the method for manufacturing the memory includes:

S100: forming an isolation layer 200 and a lead wire layer 300 on the substrate 100;

As shown in the embodiment shown in FIG. 6, the lead wire layer 300 includes a first lead wire layer 310, a second lead wire layer 320, and a third lead wire layer 330 formed sequentially and spaced apart, the first lead wire layer 310, the second lead wire layer 320, and the third lead wire layer 330 are all provided in the isolation layer 200, the first lead wire layer 310 includes a first drain 311 and a readout word line RWL integrally connected, the second lead wire layer 320 includes a first source 321 and a readout bit line RBL integrally connected, and the third lead wire layer 330 includes a second source 331 and a write bit line WBL integrally connected.

It will be appreciated that the first lead wire layer 310, the second lead wire layer 320 do not extend in the same direction, i.e., their positive projections on the substrate 100 cross, and the third lead wire layer 330 extends in the same direction with either of the first lead wire layer 310 and the second lead wire layer 320. Preferably, the positive projections of the first lead wire layer 310 and the second lead wire layer 320 on the substrate 100 are perpendicular to each other, the third lead wire layer 330 extends in the same direction as either of the first lead wire layer 310 and the second lead wire layer 320, and the positive projection of the third lead wire layer 330 on the substrate 100 overlaps with a perpendicular intersection of the positive projections of the first lead wire layer 310 and the second lead wire layer 320 on the substrate 100.

S200: forming an accommodation hole 210, penetrating through the second source 331 and the first source 321 and extending to the first drain 311, in the isolation layer 200;

As in the embodiment shown in FIG. 7, the positive projection of the accommodation hole 210 on the substrate 100 overlaps the perpendicular intersection of the positive projections of the first lead wire layer 310 and the second lead wire layer 320 on the substrate 100. The accommodation hole 210 preferably has vertical sidewalls, but it will be appreciated that the sidewalls of the accommodation hole 210 may have a tilted angle, the tilted angle is within a range that does not interfere with the formation of an electrical connection with the source-drain.

S300: sequentially forming a first channel 411, a first gate dielectric portion 511, and a first gate 611 in the accommodation hole 210 on the side away from the substrate 100;

The first drain 311 and the first source 321 are both connected to the first channel 411. The height of the bottom surface of the first gate 611 is at least lower than that of the lower surface of the second lead wire layer 320, preferably lower than that of the upper surface of the first lead wire layer 310.

S400: forming an insulating dielectric layer 800 at least on a side of the first channel 411 away from the substrate 100;

Referring to FIG. 12, the insulating dielectric layer 800 separates the first channel 411 from the second channel 421 at least.

S500: forming a second channel 421, a second gate dielectric portion 521, a second gate 621, and a write word line WWL on the side of the first channel 411 away from the substrate 100;

As in the embodiments shown in FIGS. 13-15, the second channel 421, the second gate dielectric portion 521, and the second gate 621 are all at least partially provided in the accommodation hole 210, the second channel 421 is spaced apart from the first channel 411, the first gate 611 is directly or indirectly connected to the second channel 421, the second source 331 is connected to the second channel 421, and the write word line WWL is connected to the second gate 621.

The isolation layer 200 may include a plurality of isolation material layers, and when forming the isolation layer 200, the first lead wire layer 310, the second lead wire layer 320, and the third lead wire layer 330, the first isolation material layer, the first lead wire layer 310, the second isolation material layer, the second lead wire layer 320, the third isolation material layer, the third lead wire layer 330, and the fourth isolation material layer may be formed on the substrate 100 sequentially, such that the first lead wire layer 310, the second lead wire layer 320, and the third lead wire layer 330 are isolated from each other in the isolation layer 200.

The memory includes a plurality of memory cells, each memory cell includes a read tube 20 and a write-in tube 10, the read tube 20 includes a first gate 611, a first channel 411, a first drain 311, and a first source 321, and the write-in tube 10 includes a second drain, a second source 331, a second channel 421, and a second gate 621. The plurality of memory cells are connected via a readout word line RWL, a readout bit line RBL, a write bit line WBL, and a write word line WWL.

The first channel 411 is provided wholly in the accommodation hole 210, and the second channel 421 is provided at least partially in the accommodation hole 210, which can simplify the process of manufacturing the memory in the process of forming the write-in tubes 10 and the read tubes 20 vertically stacked, thereby reducing the cost of manufacturing the memory. And the first channel 411 is wholly provided in the accommodation hole 210, the second channel 421 is at least partially provided in the accommodation hole 210, and the stacking of the first channel 411 and the second channel 421 reduces the occupancy area of the memory cell and improves the memory density.

Referring to FIGS. 8 to 15, the method of manufacturing the memory includes:

forming a first channel layer 410, a first gate dielectric layer 510, a first gate layer 610, and a first conductor layer 710 sequentially on a side of the isolation layer 200 away from the substrate 100, and the first channel layer 410, the first gate dielectric layer 510, the first gate layer 610, and the first conductor layer 710 all being at least partially provided in the accommodation hole 210;

removing a portion of the first conductor layer 710 from the top of the first conductor layer 710 to form a first conductor portion 711 in the accommodation hole 210; a surface of the first conductor portion 711 away from the surface of the substrate 100 being located between the upper surface of the second lead wire layer 320 and the lower surface of the third lead wire layer 330; removing portions of the first channel layer 410, the first gate dielectric layer 510, and the first gate layer 610 again, and forming a first channel 411, a first gate dielectric portion 511, and a first gate 611 in the accommodation hole 210, and a height of the upper surface of the first conductor portion 711 relative to the substrate 100 being greater than a height of the upper surfaces of the first channel 411, the first gate 611, and the first gate dielectric portion 511 relative to the substrate 100;

forming an insulating dielectric layer 800, surrounding the first conductor portion 711, at end surfaces of the first channel 411, the first gate 611, and the first gate dielectric portion 511 away from the substrate 100, the height of the upper surface of the insulating dielectric layer 800 relative to the substrate 100 being less than or equal to the height of the upper surface of the first conductor portion 711 relative to the substrate 100;

forming a second channel layer 420, a second gate dielectric layer 520, a second gate layer 620, a second conductor layer 720, and a fourth lead wire layer 340 sequentially on the read tube 20 and the side of the insulating dielectric layer 800 away from the substrate 100, the second channel layer 420, the second gate dielectric layer 520, the second gate layer 620, and the second conductor layer 720 being all at least partially provided in the accommodation hole 210, and patterning the second channel layer 420, the second gate dielectric layer 520, the second gate layer 620, the second conductor layer 720, and the fourth lead wire layer 340 to form a second channel 421, a second gate dielectric portion 521, a second gate 621, a second conductor portion 721, and a write word line WWL, and the second gate 621 and the write word line WWL being connected via the second conductor portion 721;

when patterning the second channel layer 420, the second gate dielectric layer 520, the second gate layer 620, the second conductor layer 720, and the fourth lead wire layer 340, coating a photoresist 900 on the fourth lead wire layer 340, and then etching the second channel layer 420, the second gate dielectric layer 520, the second gate layer 620, the second conductor layer 720, and the fourth lead wire layer 340 to the isolation layer 200 above the third lead wire layer 330, and then removing the residual photoresist 900 and covering a layer of isolation material to form the memory cell structure of FIGS. 1 and 2.

It will be appreciated that the etching may stop at the upper surface of the isolation layer 200; or over-etching may deep into the isolation layer 200 to ensure that the second channel layer 420 is fully etched during the patterning process to reduce the risk of short circuits.

The first gate 611 and the second channel 421 are spaced apart, the first conductor portion 711 is connected to the second channel 421, the first conductor portion 711 may store or drain charge when the write-in tube 10 is turned on, and the charge stored in the first conductor portion 711 affects the read current of the read tube 20.

It should be noted that the first gate 611 and the second channel 421 are spaced apart, and the first gate 611 and the second channel 421 may be indirectly connected through the first conductor portion 711, but not limited to this, and the first gate 611 may also extend to pass through the insulating dielectric layer 800 to be directly connected to the second channel 421, as the case may be.

Referring to FIGS. 8 to 15, portions of the first channel layer 410, the first gate dielectric layer 510, and the first gate layer 610 are removed by etching, such that the height of the upper surface of the first conductor portion 711 is greater than the height of the upper surfaces of the first channel 411, the first gate dielectric portion 511, and the first gate 611, and the etching is, for example, anisotropic etching, which may be a dry or wet etching. The gate layer 600 and the conductor layer 700 are formed using different materials, so that the first conductor portion 711 is not etched when the first gate layer 610 is etched.

It will be appreciated that in the step of removing portions of the first channel layer 410, the first gate dielectric layer 510, and the first gate layer 610, each of which may be etched at the same time or separately, which is not specifically limited in the present application.

The first channel layer 410, the first gate dielectric layer 510, and the first gate layer 610 are removed by etching, to ensure that the height of the upper surface of the first conductor portion 711 relative to the substrate 100 is greater than the height of the upper surfaces of the first channel 411, the first gate 611, and the first gate dielectric portion 511, to generate a filling space for the insulating dielectric layer 800 to avoid a shorting of the first channel 411, the first gate 611 and the write-in tube 10, while facilitating the connection of the first conductor portion 711 to the second channel 421. The etching is for example isotropic etching and may be dry or wet etching.

Referring to FIGS. 8 to 15, when forming the insulating dielectric layer 800, an insulating dielectric base layer covering the first conductor portion 711, the first channel 411, and the first gate dielectric portion 511 is formed at least within the accommodation hole 210, a portion of the insulating dielectric base layer is located outside the accommodation hole 210, and then the insulating dielectric layer 800 is formed by using an isotropic dry or wet etching to remove a portion of the insulating dielectric base layer. The insulating dielectric layer 800 may be made of a material different from the isolation layer 200 to create etch selectivity, so that the walls of the accommodation hole 210 are not etched when the insulating dielectric layer 800 is formed.

It is easier to control the height and shape of the insulating dielectric layer 800 by first forming an insulating dielectric base layer that fills the recesses and covers the first conductor portion 711, the first channel 411, and the first gate dielectric portion 511, and then forming the insulating dielectric layer 800 by isotropically etching the insulating dielectric base layer.

Referring to FIGS. 8 to 15, it is shown that when the accommodation hole 210 that penetrate through the first source 321 and the second source 331 and extends into the first drain 311 is formed in the isolation layer 200, the depth of the etching is greater than the depth at which the upper surface of the first drain 311 is located and less than the depth at which the lower surface of the first drain 311 is located. That is, the accommodation hole 210 extends into the first drain 311 but not penetrate through the first drain 311.

When the accommodation hole 210 formed in the isolation layer 200 extends into the first drain 311, an end of the first channel 411 near the substrate 100 is partially buried in the first drain 311, which improves the connection performance of the first drain 311 and the first channel 411, and improves the performance of the read tube 20.

Referring to FIGS. 8 to 15, a positive projection of the accommodation hole 210 on the substrate 100 is located within positive projections of the first drain 311, the first source 321, and the second source 331 on the substrate 100. Specifically, the first channel 411 may be centered relative to the first drain 311 and the first source 321, and the second channel 421 may be centered relative to the second source 331.

The first channel 411 is centered relative to the first drain 311 and the first source 321, and the second channel 421 is centered relative to the second source 331, which may improve the performance of the write-in tube 10 and the read tube 20, and may improve the performance of the memory cell.

The terms "first", "second", etc. are used for descriptive purposes only, and are not to be understood as indicating or implying relative importance or implicitly specifying the number of technical features indicated. Thus, a feature defined with "first", "second", etc. may expressly or implicitly include one or more such features. In the description of the present application, "more than one" means two or more, unless otherwise expressly and specifically limited.

In this application, unless otherwise expressly specified and limited, the terms "assembly", "connection", etc. are to be broadly construed, e.g., as a fixed connection, a detachable connection, a one-piece connection, a mechanical connection, or an electrical connection; it may be a direct connection or an indirect connection through an intermediate medium, a connection within two elements or an interaction between two elements. For those skilled in the art, the specific meanings of the above terms in this application may be understood on a case-by-case basis.

In the description of the present specification, the description with reference to the terms "some embodiments", "exemplarily", etc. means that specific features, structures, materials, or characteristics described in conjunction with the embodiments or examples are included in at least one embodiment or example of the present application. In this specification, schematic expressions of the above terms need not be directed to the same embodiment or example. Moreover, the specific features, structures, materials, or characteristics described may be combined in any one or more embodiments or examples in a suitable manner. Moreover, without contradicting each other, those skilled in the art may combine different embodiments or examples and features of different embodiments or examples described in this specification.

Although the embodiments of the present application are shown and described above, it is understood that the above embodiments are exemplary and cannot be construed as a limitation of the present application, and that those skilled in the art may make changes, modifications, substitutions and variations of the above embodiments within the scope of the present application, so that any changes or modifications made in accordance with the claims and the specification of the present application shall fall within the scope of the patent coverage of the present application.

What is claimed is:

1. A memory cell, provided in an isolation layer on a side of a substrate, the isolation layer comprising an accommodation hole, the memory cell comprising:

a channel layer, comprising a first channel and a second channel spaced apart and stacked, wherein the first channel is provided in the accommodation hole, the second channel is at least partially provided in the accommodation hole, a side of the first channel away from the substrate has a first inner hole, and a side of the second channel away from the substrate has a second inner hole;

an insulating dielectric layer, formed at least between the first channel and the second channel;

a gate layer, comprising a first gate and a second gate, wherein the first gate is formed within the first inner hole and directly or indirectly connected to the second channel, and the second gate is at least partially formed within the second inner hole; and a gate dielectric layer, formed between the gate layer and the channel layer;

wherein the memory cell further comprises a conductor layer, the conductor layer comprises a first conductor portion, and the first conductor portion is at least partially provided between the first gate and the second channel; and the first gate and the second channel are indirectly connected through the first conductor portion, and the insulating dielectric layer is provided around the first conductor portion.

2. The memory cell according to claim 1, wherein the first conductor portion is extended at least partially into the first gate within the first inner hole.

3. The memory cell according to claim 1, wherein a height of an upper surface of the first conductor portion relative to the substrate is greater than or equal to a height of an upper surface of the insulating dielectric layer relative to the substrate.

4. The memory cell according to claim 1, wherein the conductor layer further comprises a second conductor portion, the second conductor portion is at least partially provided in the second inner hole, and the second gate is provided between the second conductor portion and the gate dielectric layer.

5. The memory cell according to claim 1, wherein the memory cell further comprises a lead wire layer, the lead wire layer comprises a first lead wire layer, a second lead wire layer and a third lead wire layer spaced apart;

wherein the first lead wire layer comprises a first drain, the second lead wire layer comprises a first source, the third lead wire layer comprises a second source, the first drain and the first source are provided outside the accommodation hole and are connected to the first channel; and wherein the second source is provided outside the accommodation hole and is connected to the second channel, and the accommodation hole penetrates through the second source and the first source to connect to the first drain.

6. The memory cell according to claim 5, wherein the first channel is partially buried in the first drain near an end of the substrate.

7. A memory, comprising:

a plurality of memory cells;

write word lines connecting second gates of the plurality of memory cells;

write bit lines connecting second sources of the plurality of memory cells;

readout word lines connecting first drains of the plurality of memory cells; and readout bit lines connecting first sources of the plurality of memory cells;

where each of the plurality of memory cells is provided in an isolation layer on a side of a substrate, and the isolation layer comprises an accommodation hole, wherein each memory cell comprises:

a channel layer, comprising a first channel and a second channel spaced apart and stacked, wherein the first channel is provided in the accommodation hole, the second channel is at least partially provided in the accommodation hole, a side of the first channel away from the substrate has a first inner hole, and a side of the second channel away from the substrate has a second inner hole;

an insulating dielectric layer, formed at least between the first channel and the second channel;

a gate layer, comprising a first gate and a second gate, wherein the first gate is formed within the first inner hole and directly or indirectly connected to the second channel, and the second gate is at least partially formed within the second inner hole; and a gate dielectric layer, formed between the gate layer and the channel layer;

wherein the memory cell further comprises a conductor layer, the conductor layer comprises a first conductor portion, and the first conductor portion is at least partially provided between the first gate and the second channel; and the first gate and the second channel are indirectly connected through the first conductor portion, and the insulating dielectric layer is provided around the first conductor portion.

8. The memory according to claim 7, wherein each memory cell further comprises a conductor layer, the conductor layer comprises a first conductor portion, and the first conductor portion is at least partially provided between the first gate and the second channel; and the first gate and the second channel are indirectly connected through the first conductor portion, and the insulating dielectric layer is provided around the first conductor portion.

9. The memory according to claim 8, wherein the first conductor portion is extended at least partially into the first gate within the first inner hole.

10. The memory according to claim 8, wherein a height of an upper surface of the first conductor portion relative to the substrate is greater than or equal to a height of an upper surface of the insulating dielectric layer relative to the substrate.

11. The memory according to claim 8, wherein the conductor layer further comprises a second conductor portion, the second conductor portion is at least partially provided in the second inner hole, and the second gate is provided between the second conductor portion and the gate dielectric layer.

12. The memory according to claim 7, wherein each memory cell further comprises a lead wire layer, the lead wire layer comprises a first lead wire layer, a second lead wire layer and a third lead wire layer spaced apart;

wherein the first lead wire layer comprises a first drain, the second lead wire layer comprises a first source, the third lead wire layer comprises a second source, the first drain and the first source are provided outside the accommodation hole and are connected to the first channel; and wherein the second source is provided outside the accommodation hole and is connected to the second channel, and the accommodation hole penetrates through the second source and the first source to connect to the first drain.

13. The memory according to claim 12, wherein the first channel is partially buried in the first drain near an end of the substrate.

14. A method of manufacturing a memory, comprising:

forming an isolation layer and a lead wire layer on a substrate, wherein the lead wire layer comprises a first lead wire layer, a second lead wire layer, and a third lead wire layer formed sequentially and spaced apart, and the first lead wire layer, the second lead wire layer, and the third lead wire layer are provided in the isolation layer, wherein the first lead wire layer comprises a first drain and a readout word line integrally connected, the second lead wire layer comprises a first source and a readout bit line integrally connected, and the third lead wire layer comprises a second source and a write bit line integrally connected;

forming an accommodation hole, penetrating through the second source and the first source and extending to the first drain, in the isolation layer;

forming a first channel, a first gate dielectric portion, a first gate, and a first conductor portion in the accommodation hole, wherein the first drain and the first source are connected to the first channel;

forming an insulating dielectric layer at least on a side of the first channel away from the substrate; and forming a second channel, a second gate dielectric portion, a second gate and a write word line on a side of the insulating dielectric layer away from the substrate, wherein the second channel, the second gate dielectric portion and the second gate are at least partially provided in the accommodation hole, the first gate is connected directly or indirectly to the second channel, the second source is connected to the second channel and the write word line is connected to the second gate;

wherein forming the first channel, the first gate dielectric portion, the first gate, the first conductor portion, and the insulating dielectric layer comprises:

forming a first channel layer, a first gate dielectric layer, a first gate layer, and a first conductor layer sequentially on a side of the isolation layer away from the substrate, wherein the first channel layer, the first gate dielectric layer, the first gate layer, and the first conductor layer are at least partially provided in the accommodation hole;

removing a portion of the first conductor layer to form the first conductor portion within the accommodation hole, and removing portions of the first channel layer, the first gate dielectric layer and the first gate layer to form the first channel, the first gate dielectric portion and the first gate within the accommodation hole, wherein a height of an upper surface of the first conductor portion relative to the substrate is greater than a height of upper surfaces of the first channel, the first gate dielectric portion, and the first gate relative to the substrate; and forming the insulating dielectric layer surrounding the first conductor portion on sides of the first channel, the first gate dielectric portion, and the first gate away from the substrate, wherein a height of an upper surface of the insulating dielectric layer relative to the substrate is less than or equal to the height of the upper surface of the first conductor portion relative to the substrate.

15. The method of manufacturing the memory according to claim 14, wherein the method of manufacturing the memory further comprises:

forming a second channel layer, a second gate dielectric layer, a second gate layer, a second conductor layer, and a fourth lead wire layer sequentially on the side of the isolation layer away from the substrate, wherein the second channel layer, the second gate dielectric layer, the second gate layer, and the second conductor layer are at least partially provided in the accommodation hole; and patterning the second channel layer, the second gate dielectric layer, the second gate layer, the second conductor layer and the fourth lead wire layer, to form the second channel, the second gate dielectric portion, the second gate, a second conductor portion and the write word line.

16. The method of manufacturing the memory according to claim 15, wherein an isotropic etching is used to remove portions of the first channel layer, the first gate dielectric layer, and the first gate layer, such that the height of the upper surface of the first conductor portion is greater than the height of the upper surfaces of the first channel, the first gate dielectric portion, and the first gate.

17. The method of manufacturing the memory according to claim 15, wherein when the insulating dielectric layer is formed, an insulating dielectric base layer covering the first conductor portion, the first channel, and the first gate dielectric portion is formed within the accommodation hole; and isotropic etching is used to remove a portion of the insulating dielectric base layer to form the insulating dielectric layer.

18. The method of manufacturing the memory according to claim 14, wherein a depth of etching is greater than a depth at which an upper surface of the first drain is located when the accommodation hole penetrating through the second source and the first source and extending to the first drain is formed in the isolation layer.

19. The method of manufacturing the memory according to claim 18, wherein a positive projection of the accommodation hole on the substrate is located within positive projections of the first drain, the first source, and the second source on the substrate.

* * * * *